US012672471B2

(12) United States Patent
Hiraga

(10) Patent No.: US 12,672,471 B2
(45) Date of Patent: Jun. 30, 2026

(54) DISPLAY DEVICE AND ELECTRONIC DEVICE

(71) Applicant: SONY SEMICONDUCTOR SOLUTIONS CORPORATION, Kanagawa (JP)

(72) Inventor: Kenta Hiraga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 752 days.

(21) Appl. No.: 17/998,771

(22) PCT Filed: May 6, 2021

(86) PCT No.: PCT/JP2021/017330
§ 371 (c)(1),
(2) Date: Nov. 14, 2022

(87) PCT Pub. No.: WO2021/241148
PCT Pub. Date: Dec. 2, 2021

(65) Prior Publication Data
US 2023/0209975 A1     Jun. 29, 2023

(30) Foreign Application Priority Data
May 23, 2020     (JP) ................................. 2020-090149

(51) Int. Cl.
*H10K 59/80*        (2023.01)
*H10K 59/38*        (2023.01)
(52) U.S. Cl.
CPC ........... *H10K 59/879* (2023.02); *H10K 59/38* (2023.02)

(58) Field of Classification Search
None
See application file for complete search history.

(56) References Cited

U.S. PATENT DOCUMENTS 8,300,188 B2 * 10/2012 Usukura ............. G02F 1/13363
                                                   349/95
9,857,622 B2 * 1/2018 Wakabayashi .... G02F 1/133526
            (Continued)

FOREIGN PATENT DOCUMENTS

JP        2004-146200 A      5/2004
JP        2013-016271 A      1/2013
            (Continued)

OTHER PUBLICATIONS

International Search Report and Written Opinion of PCT Application No. PCT/JP2021/017330, issued on Jul. 27, 2021, 11 pages of ISRWO.

*Primary Examiner* — Nishath Yasmeen
(74) *Attorney, Agent, or Firm* — CHIP LAW GROUP

(57)        ABSTRACT

A display device of the present disclosure includes: a first substrate; a second substrate; a plurality of light emitting units located between the first substrate and the second substrate and arranged two-dimensionally on a base formed on the first substrate; and a plurality of on-chip microlenses provided above the plurality of light emitting units so as to each correspond to each of the light emitting units. The on-chip microlens has a truncated pyramid shape, with a rounded corner of a top of the truncated pyramid in plan view.

14 Claims, 16 Drawing Sheets

(56)                    References Cited

U.S. PATENT DOCUMENTS

| | | | |
|---|---|---|---|
| 2005/0057177 A1* | 3/2005 | Lu ........................ | H10K 59/879 |
| | | | 315/169.3 |
| 2010/0066812 A1* | 3/2010 | Kajihara ................ | H04N 23/60 |
| | | | 348/222.1 |
| 2011/0175118 A1* | 7/2011 | Hori .................... | H10K 50/865 |
| | | | 430/7 |
| 2013/0001609 A1* | 1/2013 | Ichinose ............. | H10K 59/879 |
| | | | 257/89 |
| 2017/0184776 A1* | 6/2017 | El-Ghoroury ......... | G02B 30/50 |
| 2019/0067383 A1 | 2/2019 | Jo et al. | |

FOREIGN PATENT DOCUMENTS

| | | | |
|---|---|---|---|
| JP | 2013058447 A * | 3/2013 | |
| JP | 2019-508725 A | 3/2019 | |
| WO | 2008/020514 A1 | 2/2008 | |
| WO | 2018/135189 A1 | 7/2018 | |

* cited by examiner

FIG.3

OBSERVATION
POSITION a

80

LENS BOTTOM
SURFACE

LENS TOP
SURFACE

OBSERVATION
POSITION b

A — — — A

TOP SURFACE
DIMENSION

80

BOTTOM SURFACE
DIMENSION

OBSERVATION POSITION a

OBSERVATION POSITION b

80

LENS BOTTOM SURFACE

LENS TOP SURFACE

B

B

X

TOP SURFACE DIMENSION

BOTTOM SURFACE DIMENSION

80

(STEP 1)

(STEP 2)

(STEP 3)

LENS THICKNESS IS SLIGHTLY REDUCED (STEP 4)

LENS BOTTOM SURFACE

LENS TOP SURFACE

DISPLAY DEVICE AND ELECTRONIC DEVICE

CROSS REFERENCE TO RELATED APPLICATIONS

This application is a U.S. National Phase of International Patent Application No. PCT/JP2021/017330 filed on May 6, 2021, which claims priority benefit of Japanese Patent Application No. JP 2020-090149 filed in the Japan Patent Office on May 23, 2020. Each of the above-referenced applications is hereby incorporated herein by reference in its entirety.

FIELD

The present disclosure relates to a display device and an electronic device.

BACKGROUND

Among display devices in recent years, a flat type (flat panel type) display device has been the mainstream. As one of the flat type display devices, there is a display device using a current drive type electro-optical element in which light emission luminance changes according to a value of current flowing through the device, as a light emitting unit (light emitting element) of a pixel. Examples of the current drive type electro-optical element include an organic electroluminescence (hereinafter, referred to as "EL" in some cases) element (organic EL element) that uses electroluminescence of an organic material and emits light by using a phenomenon of emitting light when an electric field is applied to an organic thin film.

In an organic EL display device using an organic EL element as a light emitting unit of a pixel, there is a technology of providing an on-chip microlens as one of light extraction technologies for achieving higher luminance of the organic EL element. Examples of the shape of the on-chip microlens include a spherical shape and a truncated pyramid shape. Patent Literature 1 (JP 2004-146200 A) discloses a display device using an on-chip microlens having a truncated pyramid shape.

CITATION LIST

Patent Literature

Patent Literature 1: JP 2004-146200 A

SUMMARY

Technical Problem

The on-chip microlens having a truncated pyramid shape can make the shape of the bottom of the truncated pyramid into rectangular in plan view, capable of maximizing the lens area, leading to an advantage of further enhancing a lens effect. On the other hand, the on-chip microlens having a truncated pyramid shape has a corner with a sharp angle change at the top of the truncated pyramid, leading to an occurrence of a sudden change in luminance depending on an observation position of the observer, which can adversely affect image quality.

An object of the present disclosure is to provide a display device and an electronic device including the display device, capable of suppressing discomfort felt by an observer, caused by a sudden change in luminance, even when an on-chip microlens has a truncated pyramid shape.

Solution to Problem

A display device of the present disclosure in order to solve the above problem includes:
  a first substrate;
  a second substrate;
  a plurality of light emitting units located between the first substrate and the second substrate and arranged two-dimensionally on a base formed on the first substrate; and
  a plurality of on-chip microlenses provided above the plurality of light emitting units so as to each correspond to each of the light emitting units.

The on-chip microlens has a truncated pyramid shape, with a rounded corner of a top of the truncated pyramid in plan view.

Moreover, an electronic device of the present disclosure in order to solve the above problem includes the display device configured as above.

BRIEF DESCRIPTION OF DRAWINGS

FIG. 3 is a schematic partial cross-sectional view of a display panel in a display device to which the technology of the present disclosure is applied.

DESCRIPTION OF EMBODIMENTS

Figure 1:
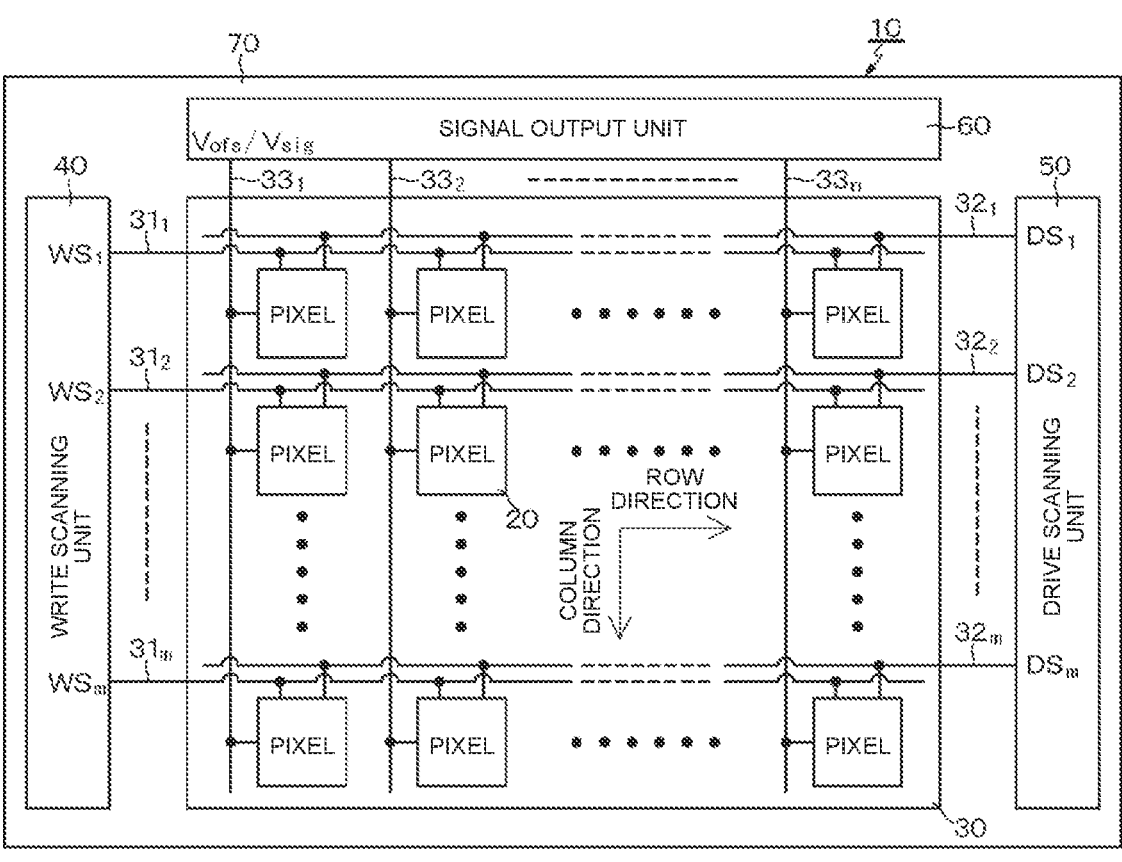
FIG. 1 is a system configuration diagram schematically illustrating an outline of a basic configuration of a display device to which the technology of the present disclosure is applied.

Hereinafter, modes for carrying out the technology of the present disclosure (hereinafter, described as "embodiments") will be described in detail with reference to the drawings. The technology of the present disclosure is not limited to the embodiments. In the following description, the same reference numerals will be used for the same elements or same functional elements, and redundant description will be omitted. Note that the description will be given in the following order.

1. Overview of display device and electronic device of present disclosure
2. Display device to which technology of present disclosure is applied (example of organic EL display device)
2-1. System configuration
2-2. Pixel circuit
2-3. Cross-sectional structure of display panel
2-4. On-chip microlens
3. On-chip microlens according to embodiment
3-1. First exemplary embodiment (example in which bottom of truncated pyramid has a quadrangular shape in plan view)
3-2. Second exemplary embodiment (example of method of manufacturing on-chip microlens according to first exemplary embodiment)
3-3. Third exemplary embodiment (modification of first exemplary embodiment: example in which gap exists between bottom surfaces of four on-chip microlenses vertically and horizontally adjacent to each other)
3-4. Fourth exemplary embodiment (modification of first exemplary embodiment: an example in which the bottom of the truncated pyramid has a hexagonal shape in plan view)
3-5. Fifth exemplary embodiment (modification of first exemplary embodiment: an example in which the bottom of the truncated pyramid has a rectangular shape in plan view)
3-6. Sixth exemplary embodiment (modification of fifth exemplary embodiment: example in which the bottom of the truncated pyramid has a rectangular shape in plan view, the bottoms having mutually different sizes for each pixel)
3-7. Seventh exemplary embodiment (example in which color filter layer and on-chip microlens are provided to be biased with respect to light emitting unit)
4. Modifications
5. Electronic device of present disclosure
5-1. Example 1 (example of smartphone)
5-2. Example 2 (example of head-mounted display)
5-3. Example 3 (example of digital still camera)
6. Configuration achievable by present disclosure Overview of Display Device and Electronic Device of Present Disclosure In the display device and the electronic device of the present disclosure, the bottom of the truncated pyramid can be formed to have a shape different from the shape of the top thereof in plan view. Furthermore, the bottom of the truncated pyramid may have a quadrangular shape in plan view.

In the display device and the electronic device of the present disclosure including the preferable configuration described above, the corner of the bottom of the truncated pyramid can be rounded in plan view. At this time, the radius of curvature of the rounded corner of the bottom of the truncated pyramid is preferably smaller than the radius of curvature of the rounded corner of the top.

Furthermore, in the display device and the electronic device of the present disclosure including the preferable configuration described above, the bottom of the truncated pyramid can be formed to have a hexagonal or rectangular shape in plan view. Furthermore, the truncated pyramid can be formed to have a different size for each pixel including the light emitting unit in plan view.

Furthermore, in the display device and the electronic device of the present disclosure including the preferable configuration described above, the light emitting unit may include an organic electroluminescence element and emit white light.

Furthermore, in the display device and the electronic device of the present disclosure including the preferable configuration described above, a color filter layer corresponding to each light emitting unit may be formed above the plurality of light emitting units, and an on-chip microlens may be provided above the color filter layer.

Furthermore, in the display device and the electronic device of the present disclosure including the preferable configuration described above, the color filter layer and the on-chip microlens may be provided on a display panel in a state of being biased with respect to the light emitting unit depending on a location on a display panel, with pixels including the light emitting unit being two-dimensionally arranged on the display panel. Preferably, the color filter layer and the on-chip microlens may be provided in a state of being biased with respect to the light emitting unit such that an optical axis is inclined toward a central portion of the display panel in both ends in a row direction of the display panel.

Display Device to which Technology of the Present Disclosure is Applied

A display device of the present disclosure is an active matrix display device that controls a current flowing through an electro-optical element by an active element provided in the same pixel circuit as the electro-optical element, for example, an insulated gate field effect transistor. Typical examples of the insulated gate field effect transistor include a metal oxide semiconductor (MOS) transistor or a thin film transistor (TFT).

Here, the display device of the present disclosure will be described using an example of an active matrix organic EL display device that uses an organic electroluminescence element (organic EL element), which is an example of a current drive type electro-optical element, as a light emitting unit (light emitting element) of a pixel circuit. Hereinafter, the "pixel circuit" may be simply referred to as a "pixel".

System Configuration

FIG. 1 is a system configuration diagram schematically illustrating an outline of a basic configuration of an active matrix organic EL display device which is a display device to which the technology of the present disclosure is applied.

As illustrated in FIG. 1, an organic EL display device 10, which is an active matrix display device, to which the technology of the present disclosure is applied, has a configuration including: a pixel array unit 30 in which a plurality of pixels 20 including organic EL elements is two-dimensionally arranged in a matrix; and a peripheral circuit (peripheral drive unit) arranged in a peripheral region of the pixel array unit 30.

The peripheral circuit of the pixel region includes a write scanning unit 40, a drive scanning unit 50, a signal output unit 60, mounted on the same display panel 70 as the pixel array unit 30, for example, and drives each pixel 20 of the pixel array unit 30. Note that some or all of the write scanning unit 40, the drive scanning unit 50, and the signal output unit 60 may be provided outside the display panel 70.

The organic EL display device 10 can be configured to support monochrome (black-and-white) display or color display. In a case where the organic EL display device 10 supports color display, one pixel (unit pixel) as a unit of forming a color image includes a plurality of subpixels (sub-pixels). At this time, each of the subpixels corresponds to the pixel 20 in FIG. 1. More specifically, in a display device supporting color display, one pixel includes three subpixels, namely, a subpixel 20R emitting red (R) light, a subpixel 20G emitting green (G) light, and a subpixel 20B emitting blue (B) light, for example.

However, formation of one pixel is not limited to a combination of subpixels of three primary colors of R, G, and B, and one pixel can be formed by further adding subpixels of one color or a plurality of colors to the subpixels of the three primary colors. More specifically, for example, it is also possible to form one pixel by adding a subpixel that emits white (W) light for improvement of luminance, or possible to form one pixel by adding at least one subpixel that emits complementary color light for expanding a color reproduction range.

The pixel array unit 30 has wiring lines including scanning lines 31 ($31_1$ to $31_m$) and drive lines 32 ($32_1$ to $32_m$) arranged for each pixel row in a first direction (row direction/horizontal direction) with respect to the array of the pixels 20 in a m-row/n-column pattern. Furthermore, signal lines 33 ($33_1$ to $33_n$) are arranged for each pixel column in a second direction (column direction/vertical direction) with respect to the array of the pixels 20 in the m-row/n-column pattern.

Each of the scanning lines $31_1$ to $31_m$ is connected to an output end of a corresponding row of the write scanning unit 40. Each of the drive lines $32_1$ to $32_m$ is connected to an output end of a corresponding row of the drive scanning unit 50. Each of the signal lines $33_1$ to $33_n$ is connected to an output end of a corresponding column of the signal output unit 60.

The write scanning unit 40 includes a shift register circuit and the like. When writing a signal voltage of a video signal to each pixel 20 of the pixel array unit 30, the write scanning unit 40 sequentially supplies write scanning signal WS (WS₁ to WS$_m$) to the scanning lines 31 ($31_1$ to $31_m$) to sequentially scan each pixel 20 of the pixel array unit 30 row by row, that is, perform sequential line scanning.

The drive scanning unit 50 includes a shift register circuit and the like, similarly to the write scanning unit 40. The drive scanning unit 50 supplies light emission control signal DS (DS₁ to DS$_m$) to the drive lines 32 ($32_1$ to $32_m$) in synchronization with the sequential line scanning by the write scanning unit 40, thereby controlling light emission/non-light emission (light extinction) of the pixel 20.

The signal output unit 60 selectively outputs a signal voltage $V_{sig}$ of a video signal (hereinafter, simply described as a "signal voltage $V_{sig}$" in some cases) corresponding to luminance information supplied from a signal supply source (not illustrated) and a reference voltage $V_{ofs}$. Here, the reference voltage $V_{ofs}$ is a voltage corresponding to or in the vicinity of a voltage provided as a reference of the signal voltage $V_{sig}$ of the video signal (for example, a voltage corresponding to the black level of the video signal). The reference voltage $V_{ofs}$ is used as an initialization voltage when the correction operation is performed.

The signal voltage $V_{sig}$/the reference voltage $V_{ofs}$ alternatively output from the signal output unit 60 is written to each pixel 20 of the pixel array unit 30 via the signal lines 33 ($33_1$ to $33_n$) in units of pixel rows selected by the sequential line scanning performed by the write scanning unit 40. That is, the signal output unit 60 adopts a sequential line writing drive mode in which the signal voltage $V_{sig}$ is written in units of pixel rows (lines).

Pixel Circuit

Figure 2:
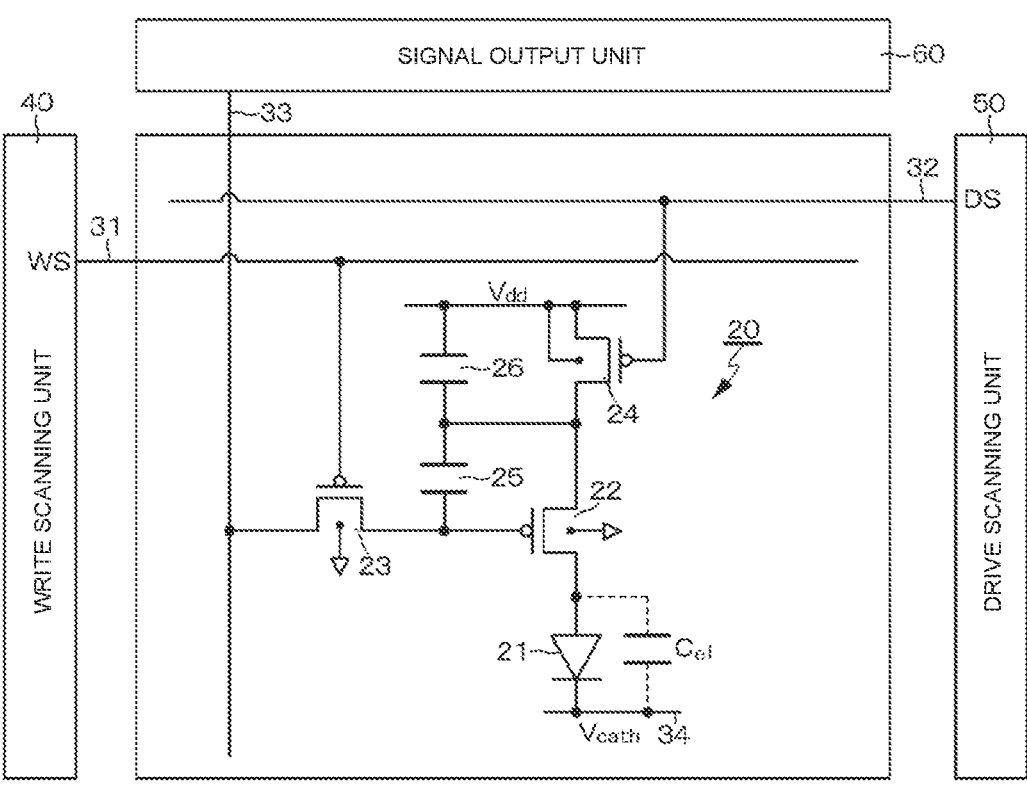
FIG. 2 is a circuit diagram illustrating a circuit configuration of a unit pixel (pixel circuit).

FIG. 2 is a circuit diagram illustrating an example of a circuit configuration of a pixel (pixel circuit) in the active matrix organic EL display device 10. The light emitting unit of the pixel 20 (subpixels 20R, 20G, and 20B) is formed of the organic EL element 21. The organic EL element 21 is an example of a current drive type electro-optical element in which the light emission luminance changes depending on the value of the current flowing through the device.

As illustrated in FIG. 2, the pixel 20 (subpixels 20R, 20G, and 20B) includes: an organic EL element 21; and a drive circuit (pixel drive circuit) that drives the organic EL element 21 by applying a current to the organic EL element 21. The organic EL element 21 has a cathode electrode connected to a common power supply line 34 arranged in common for all the pixels 20. In the drawing, $C_{el}$ is an equivalent capacity of the organic EL element 21.

The drive circuit that drives the organic EL element 21 includes a drive transistor 22, a sampling transistor 23, a light emission control transistor 24, a retention capacitor 25, and an auxiliary capacitor 26. Here, it is assumed that the organic EL element 21 and its drive circuit are formed not on an insulating substrate such as a glass substrate but on a semiconductor substrate such as a silicon substrate, and a configuration using a P-channel transistor is adopted as the drive transistor 22.

Furthermore, in the present exemplary embodiment, the sampling transistor 23 and the light emission control transistor 24 also adopt a configuration using a P-channel transistor similarly to the drive transistor 22. Consequently, the drive transistor 22, the sampling transistor 23, and the light emission control transistor 24 each have four terminals of source/gate/drain/back gate, instead of three terminals of source/gate/drain. The back gate is a terminal to which a power supply voltage $V_{dd}$ is applied.

However, the sampling transistor 23 and the light emission control transistor 24 are switching transistors that function as switch elements, and thus are not limited to P-channel transistors. Therefore, the sampling transistor 23 and the light emission control transistor 24 may be N-channel transistors or may have a configuration in which P-channel transistors and N-channel transistors are mixed.

In the pixel 20 having the above configuration, the sampling transistor 23 samples the signal voltage $V_{sig}$ of the video signal supplied from the signal output unit 60 through the signal line 33, and writes the sampled signal voltage $V_{sig}$ into the retention capacitor 25. The light emission control transistor 24 is connected between the node of the power supply voltage $V_{dd}$ and the source electrode of the drive transistor 22, and controls light emission/non-light emission of the organic EL element 21 under driving by the light emission control signal DS.

The retention capacitor 25 is connected between the gate electrode and the source electrode of the drive transistor 22. The retention capacitor 25 retains the signal voltage $V_{sig}$ of the video signal written by sampling of the sampling transistor 23. The drive transistor 22 drives the organic EL element 21 by applying a drive current corresponding to the retention voltage of the retention capacitor 25 to the organic EL element 21.

The auxiliary capacitor 26 is connected between the source electrode of the drive transistor 22 and a node of a fixed potential, for example, a node of the power supply voltage $V_{dd}$. The auxiliary capacitor 26 has an effect of suppressing fluctuation of the source potential of the drive transistor 22 when the signal voltage $V_{sig}$ of the video signal is written, and an effect of setting a gate-source voltage $V_{gs}$ of the drive transistor 22 to a threshold voltage $V_{th}$ of the drive transistor 22.

Cross-Sectional Structure of Display Panel

Figure 3:
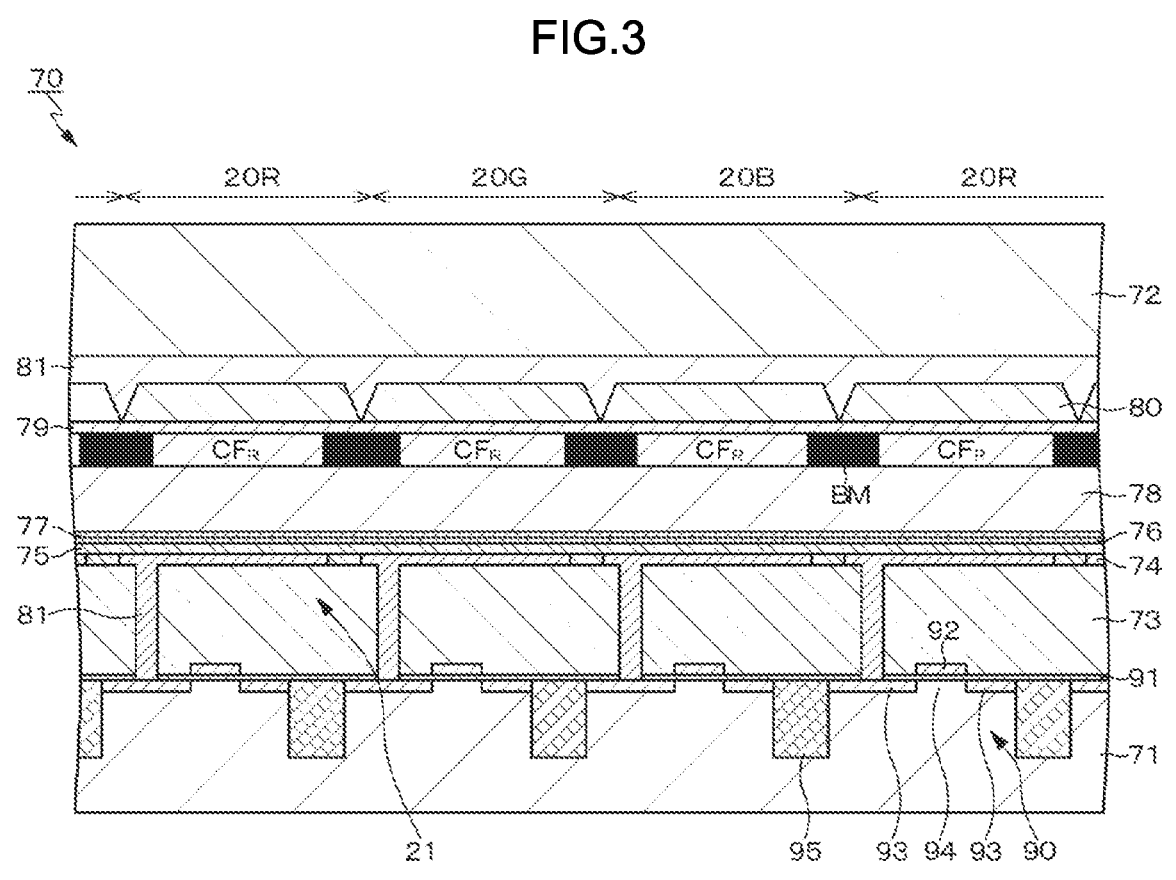

FIG. 3 is a schematic partial cross-sectional view of a display panel 70 in a display device to which the technology of the present disclosure is applied, namely, the organic EL display device 10.

As illustrated in FIG. 3, the display panel 70 according to the present exemplary embodiment includes: a first substrate 71; a second substrate 72; and a plurality of pixels 20 located between the first substrate 71 and the second substrate 72 and arranged two-dimensionally on a base 73 formed on the first substrate 71. The first substrate 71 or the second substrate 72 can be formed by using a semiconductor substrate such as a silicon substrate, or an insulating substrate such as a glass substrate or a quartz substrate. In the display panel 70 according to the present exemplary embodiment, an exemplary case where a semiconductor substrate such as a silicon substrate is used as the first substrate 71 will be described.

In the display panel 70 according to the present exemplary embodiment, the pixel 20 includes at least a first electrode layer 74 formed on the base 73, an organic layer 75 formed on the first electrode layer 74, a second electrode layer 76 formed on the organic layer 75, a protective film 77 formed on the second electrode layer 76, and a planarization layer 78 formed on the protective film 77. The first electrode layer

74 can function as an anode electrode, and the second electrode layer 76 can function as a cathode electrode.

The organic layer 75 includes a light emitting layer formed of an organic light emitting material, and constitutes the organic EL element 21. Specifically, the organic layer 75 can include, for example, a stacked structure of a hole transport layer, a light emitting layer, and an electron transport layer, a stacked structure of a hole transport layer and a light emitting layer also serving as an electron transport layer, a stacked structure of a hole injection layer, a hole transport layer, a light emitting layer, an electron transport layer, and an electron injection layer, and the like.

The organic layer 75 has a stacked structure of a red light emitting layer, a green light emitting layer, and a blue light emitting layer. One pixel 20 includes three subpixels, namely, the red subpixel 20R, the green subpixel 20G, and the blue subpixel 20B. The organic layer 75 constituting the organic EL element 21 emits white light, and each of the subpixels 20R, 20G, and 20B respectively includes a combination of the organic layer 75 emitting white light and color filter layers $CF_R$, $CF_G$, and $CF_B$.

The red subpixel 20R designed to display red is provided with the red color filter layer $CF_R$, the green subpixel 20G designed to display green is provided with the green color filter layer $CF_G$, and the blue subpixel 20B designed to display blue is provided with the blue color filter layer $CF_B$. The red subpixel 20R, the green subpixel 20G, and the blue subpixel 20B have the same configuration and structure except for positions of a color filter layer and a light emitting layer.

The color filter layers $CF_R$, $CF_G$, and $CF_B$ are formed on the planarization layer 78 for each of the subpixels 20R, 20G, and 20B, respectively, and an on-chip microlens 80 formed of a known material is provided on the color filter layers $CF_R$, $CF_G$, and $CF_B$ by a known method through an underlying substrate 79 so as to correspond to the organic EL element 21. With the presence of the on-chip microlens 80, it is possible to avoid color mixture between adjacent pixels, and possible to appropriately diverge a light beam according to a required viewing angle. The color filter layers $CF_R$, $CF_G$, and $CF_B$ and the on-chip microlens 80 are bonded to the second substrate 72 via a sealing resin layer 81.

There is provided a black matrix layer BM between the color filter layers $CF_R$, $CF_G$, and $CF_B$. The black matrix layer BM includes, for example, a black resin film (specifically, a black polyimide resin, for example) mixed with a black colorant and having an optical density of 1 or more.

There is provided a light emitting unit drive unit below the base (interlayer insulating layer) 73. The light emitting unit drive unit can have a known circuit configuration (for example, the circuit configuration of FIG. 2). The light emitting unit drive unit includes a transistor (Specifically, the MOSFET) formed on a silicon substrate corresponding to the first substrate 71. The transistor 90 including a MOSFET includes: a gate insulating layer 91 formed on the first substrate 71; a gate electrode 92 formed on the gate insulating layer 91; a source/drain region 93 formed on the first substrate 71; a channel formation region 94 formed between the source/drain regions 93-93; and an element isolation region 95 surrounding the channel formation region 94 and the source/drain region 93. The transistor 90 and the first electrode layer 74 are electrically connected to each other via a contact plug 81 provided in the base 73. Note that, in FIG. 3, one transistor 90 is illustrated for one light emitting unit drive unit.

On-Chip Microlens

The display panel 70 having the above-described configuration includes the on-chip microlens 80 in order to improve light extraction efficiency for the purpose of achieving higher luminance of the organic EL element. The on-chip microlens 80 can be made of, for example, a known acrylic resin, and can be obtained by melt-flowing the acrylic resin, or can be obtained by etching back.

Figure 4A:
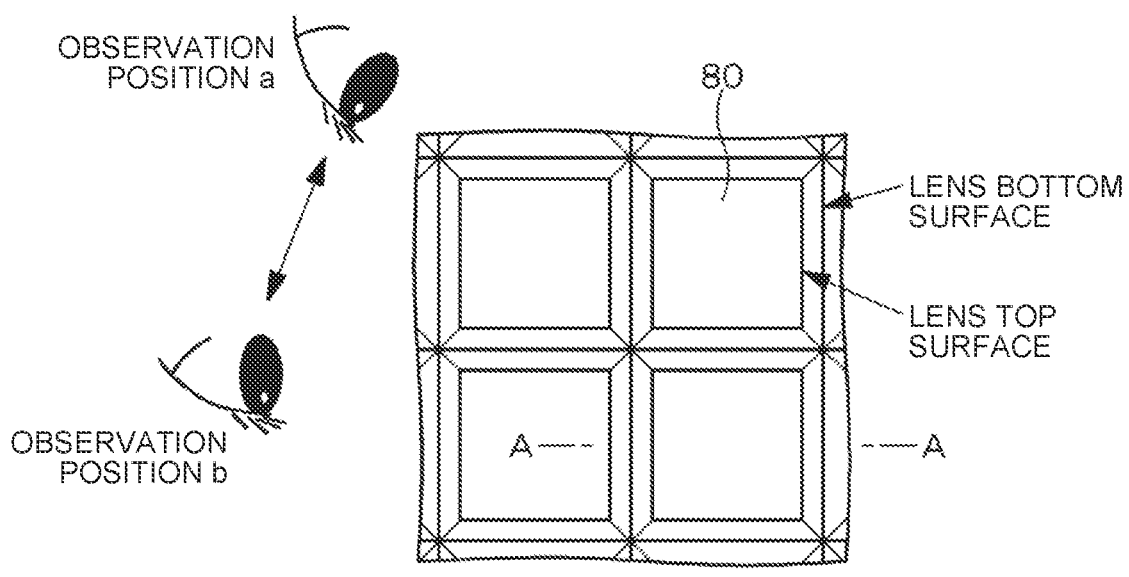
FIG. 4A is a plan view of a truncated pyramid shaped on-chip microlens according to a known example.
Figure 4B:
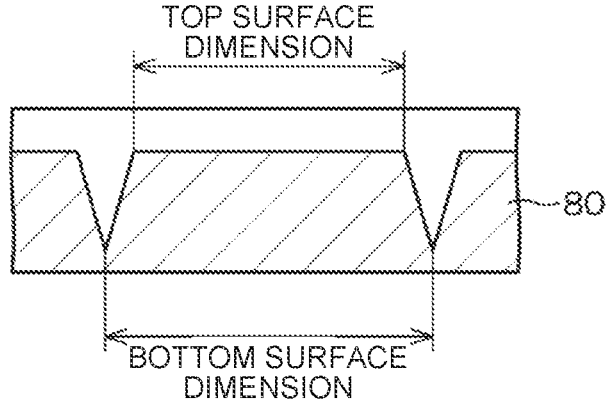
FIG. 4B is an end view of a cross section taken along line A-A in FIG. 4A.

The on-chip microlens 80 is formed by using a truncated pyramid shaped microlens capable of maximizing the lens area and further enhancing the lens effect. FIG. 4A illustrates a plan view of a truncated pyramid shaped on-chip microlens 80 according to a known example, and FIG. 4B illustrates an end view of a cross section taken along line A-A in FIG. 4A. The truncated pyramid shaped on-chip microlens 80 can maximize the lens area and can further enhance the lens effect. On the other hand, since the truncated pyramid shaped on-chip microlens has a corner with a sharp angle change at the top of the truncated pyramid, there can be a sudden change in luminance depending on the observation position of the observer, specifically, between an observation position a corresponding to the side surface of the truncated pyramid and an observation position b corresponding to the corner of the top of the truncated pyramid, leading to a concern of adversely affecting image quality.

On-Chip Microlens According to Embodiment

As described above, the display device according to the embodiment of the present disclosure, specifically, the organic EL display device 10 includes the plurality of pixels 20 (subpixels 20R, 20G, and 20B) located between the first substrate 71 and the second substrate 72 and arranged two-dimensionally on the base 73 formed on the first substrate 71. The plurality of pixels 20 (subpixels 20R, 20G, and 20B) includes an on-chip microlens 80 provided corresponding to each organic EL element 21 above the light emitting unit (light emitting element), more specifically, the organic EL element 21.

The organic EL display device 10 according to the embodiment of the present disclosure uses, as the on-chip microlens 80, a microlens having a truncated pyramid shape, and the truncated pyramid on-chip microlens 80 has a configuration in which a corner of the top of the truncated pyramid is rounded (having roundness) in plan view. In this manner, since the corner of the top of the truncated pyramid is rounded (curved) in plan view, even with the truncated pyramid shape of the on-chip microlens 80, it is possible to suppress the discomfort caused by the sudden luminance change felt by the observer due to the change in the observation position.

Hereinafter, specific exemplary embodiments of the on-chip microlens 80 having a truncated pyramid shape and used in the organic EL display device according to the embodiment of the present disclosure will be described.

First Exemplary Embodiment

Figure 5A:
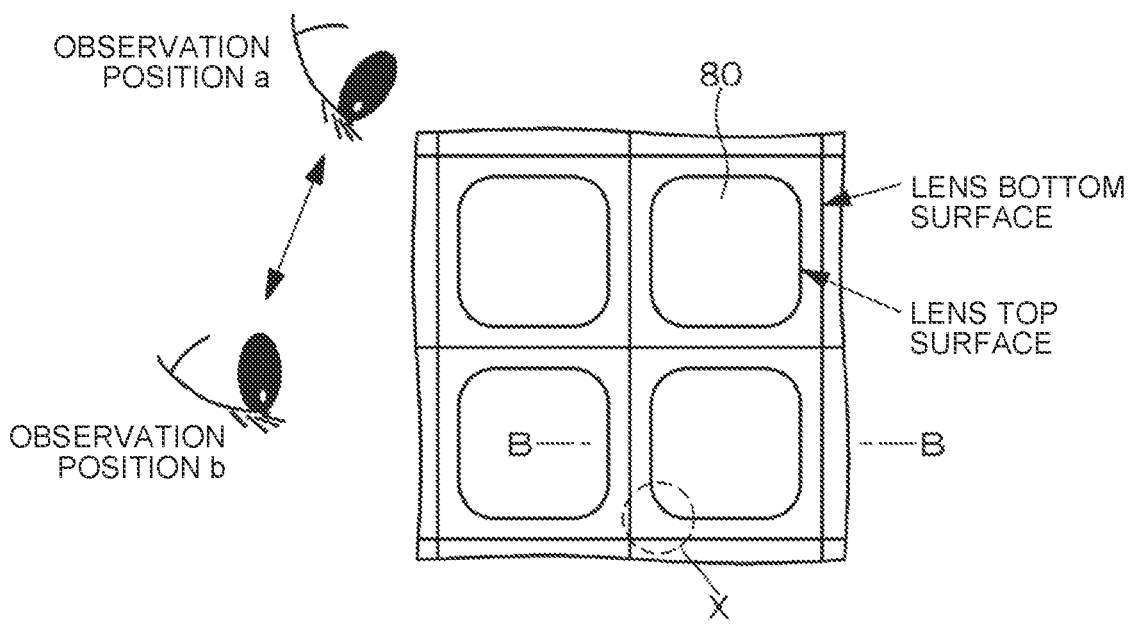
FIG. 5A is a plan view of an on-chip microlens according to a first exemplary embodiment.
Figure 5B:
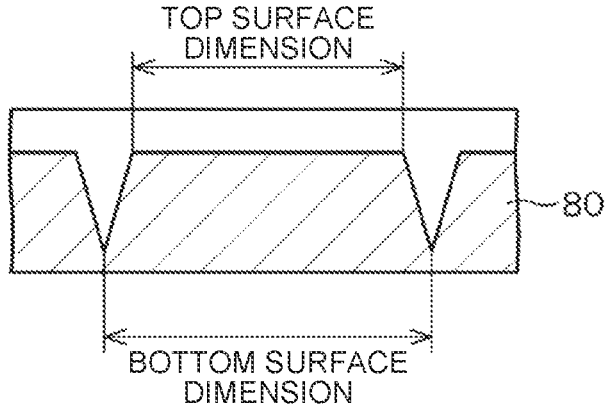
FIG. 5B is an end view of a cross section taken along line B-B in FIG. 5A.

A first exemplary embodiment is an example of an on-chip microlens in which a bottom of a truncated pyramid has a quadrangular (square) shape in plan view. FIG. 5A illustrates a plan view of the on-chip microlens 80 according to first exemplary embodiment, and FIG. 5B illustrates an end view of a cross section taken along line B-B in FIG. 5A.

The on-chip microlens 80 according to first exemplary embodiment has a truncated pyramid shape. With this configuration, the bottom of the truncated pyramid can be formed into a rectangular shape in plan view, and this form can maximize the lens area, making it possible to further enhance the lens effect. In addition, the on-chip microlens 80 according to the first exemplary embodiment has a configuration in which a corner X of the top of the truncated pyramid (having a quadrangular shape in plan view) is rounded in plan view. That is, the top surface and the bottom have different shapes in plan view.

with the rounded (curved) shape of the corner X at the top of the truncated pyramid in plan view in this manner, it is possible to have a gentle shape change at the corner X. With this configuration, the luminance gradually changes when the observation position of the observer changes from the observation position a corresponding to the side surface of the truncated pyramid to the observation position b corresponding to the corner X of the top of the truncated pyramid, making it possible to alleviate the discomfort caused by the luminance change felt by the observer when the corner X is not rounded.

It is allowable to use any degree of roundness (radius of curvature) of the corner X of the top in the on-chip microlens 80 having a truncated pyramid shape. Still, it can be said that the closer the plan view shape of the top to a circle, the more the discomfort due to the luminance change accompanying the change in the observation position of the observer can be alleviated.

Second Exemplary Embodiment

Figure 6:
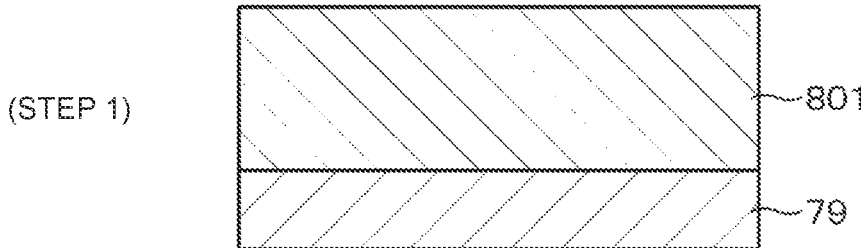
FIG. 6 is a process diagram (part 1) of a method of manufacturing an on-chip microlens according to a second exemplary embodiment.
Figure 6:
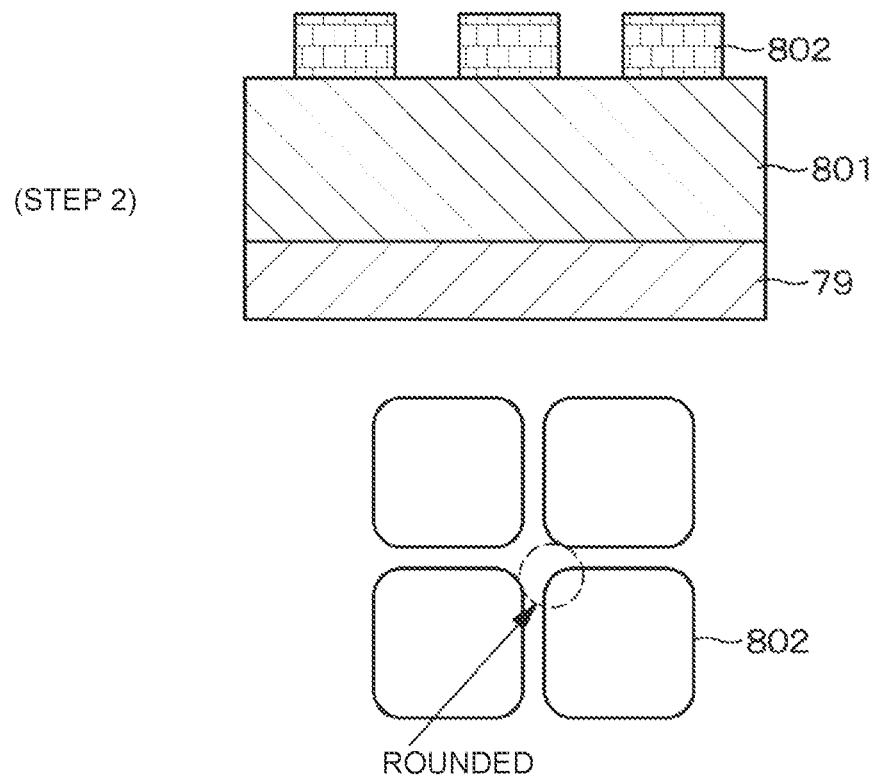
Figure 7:
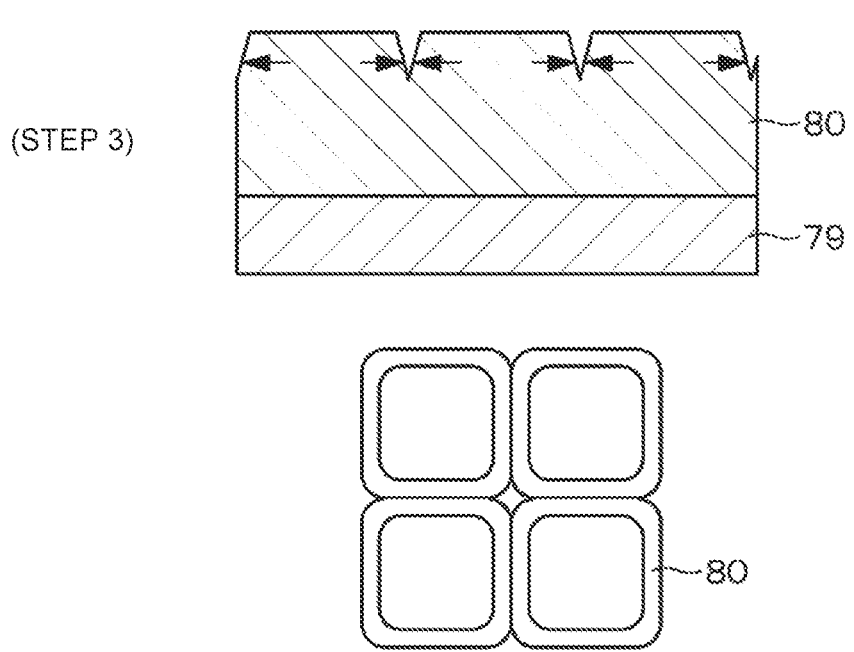
FIG. 7 is a process diagram (part 2) of the method of manufacturing the on-chip microlens according to the second exemplary embodiment.
Figure 7:
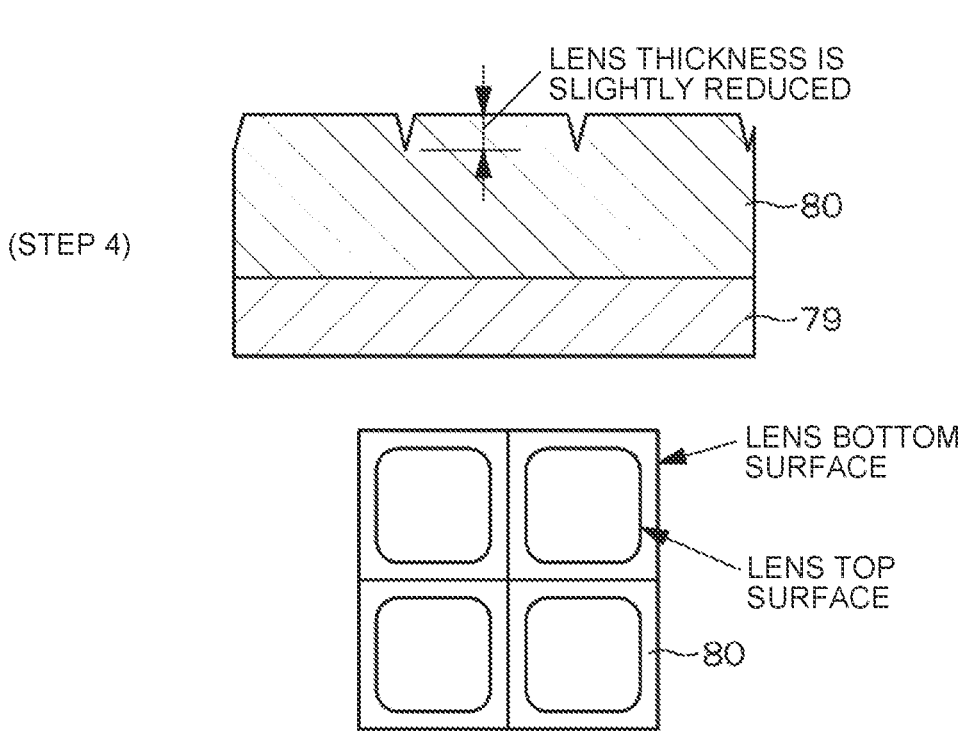

A second exemplary embodiment is an example of a method of fabricating the on-chip microlens 80 according to the first exemplary embodiment. FIGS. 6 and 7 illustrate process diagrams (part 1) and process diagrams (part 2) of the method of manufacturing the on-chip microlens according to the second exemplary embodiment. Here, for simplification of the drawing, fabrication of four on-chip microlenses vertically and horizontally adjacent to each other will be exemplified.

Step 1 is a step of forming a foundation 801 of the microlens, in which the foundation 801 of the lens formed of a resin material to be the microlens is formed on the underlying substrate 79. Examples of the resin material serving as the microlens include an acrylic resin.

Step 2 is a step of photography, in which a photoresist 802 having a rectangular shape is formed on the foundation 801 of the microlens, and the photoresist 802 is irradiated with light such as ultraviolet rays and exposed. At this time, corners of the planar shape of the photoresist 802 are rounded.

Step 3 is a step of dry etching, in which the shape of a truncated pyramid is transferred by performing dry etching on a resin material to be a microlens by using a reactive gas, ions, or radicals. At the time of this dry etching, adhesion of a processing product flattens the taper to form a truncated pyramid shape. At this time, since the corner of the planar shape of the photoresist 802 is rounded, the corner of the top of the transferred truncated pyramid shaped microlens will be rounded.

Step 4 is a final step. When the etching time of the dry etching is extended, the shape of the bottom surface of the truncated pyramid approaches a quadrangular (square) shape due to the progress of the deposition of the processing product, although the corner of the top remains rounded. Note that the prolonged etching time would slightly reduce the lens thickness.

According to the above-described method of manufacturing the on-chip microlens according to the second exemplary embodiment, it is possible to fabricate the on-chip microlens 80 according to the first exemplary embodiment, that is, the on-chip microlens 80 having a truncated pyramid shape, more specifically, a regular quadrangular truncated pyramid shape having a rounded corner at the top of the truncated pyramid in plan view.

Third Exemplary Embodiment

Figure 8A:
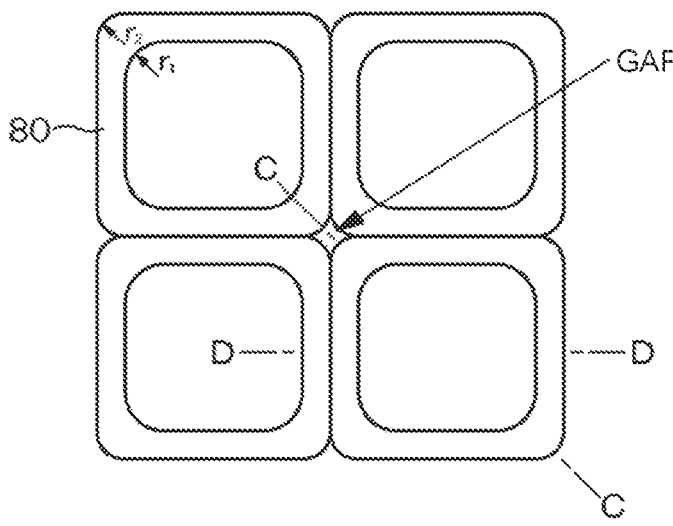
FIG. 8A is a plan view of an on-chip microlens according to a third exemplary embodiment.
Figure 8B:
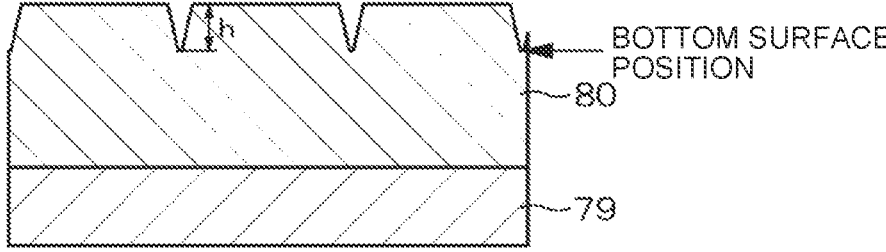
FIG. 8B is an end view of a cross section taken along line C-C in FIG. 8A.
Figure 8C:
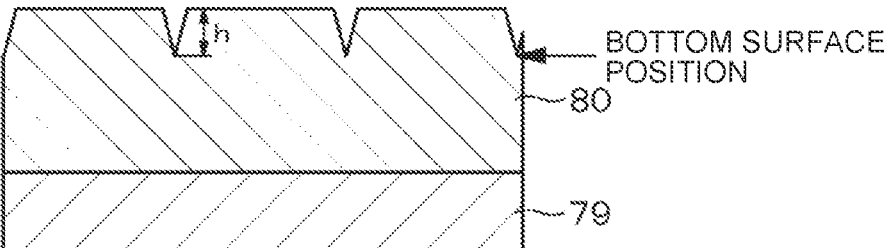
FIG. 8C is an end view of a cross section taken along line D-D in FIG. 8A.

A third exemplary embodiment is a modification of the first exemplary embodiment and is an example in which gap exists between bottom surfaces of four on-chip microlenses vertically and horizontally adjacent to each other. FIG. 8A illustrates a plan view of the on-chip microlens 80 according to third exemplary embodiment; FIG. 8B illustrates an end view of a cross section taken along line C-C in FIG. 8A; and FIG. 8C illustrates an end view of a cross section taken along line D-D in FIG. 8A.

In the on-chip microlens 80 (refer to FIG. 5A) according to first exemplary embodiment, there is no gap between the bottoms of the four on-chip microlenses vertically and horizontally adjacent to each other, and the bottoms are in close contact with each other. In contrast, the on-chip microlens 80 according to the third exemplary embodiment has a configuration in which a gap exists between the bottoms of the four on-chip microlenses 80 vertically and horizontally adjacent to each other.

The gap between the bottoms of the four on-chip microlenses 80 adjacent to each other exits because of the rounded (curved) shape of the corners of the bottoms of the on-chip microlenses 80 in plan view. Here, when the curvature of the rounded corner of the top is $r_1$, it is preferable that a curvature $r_2$ of the rounded corner of the bottom is preferably smaller than the curvature $r_1$ of the top ($r_1 > r_2$). This indicates that the top surface and the bottom surface have different shapes in plan view. The smaller the curvature $r_2$ of the rounded corner of the bottom, the more lens area can be obtained, leading to further enhancement in the lens effect.

The third exemplary embodiment having the gap between the bottoms of the four on-chip microlenses 80 vertically and horizontally adjacent to each other is disadvantageous as compared with the case of the first exemplary embodiment with no gap from the viewpoint of the lens area. However, the configuration of third exemplary embodiment is applicable depending on the manufacturing method.

Incidentally, in the regular quadrangular pyramid shaped on-chip microlens 80, the thickness of the lens can be different between a cross section in a diagonal direction and a cross section in a direction perpendicular to a side.

Fourth Exemplary Embodiment

Figure 9A:
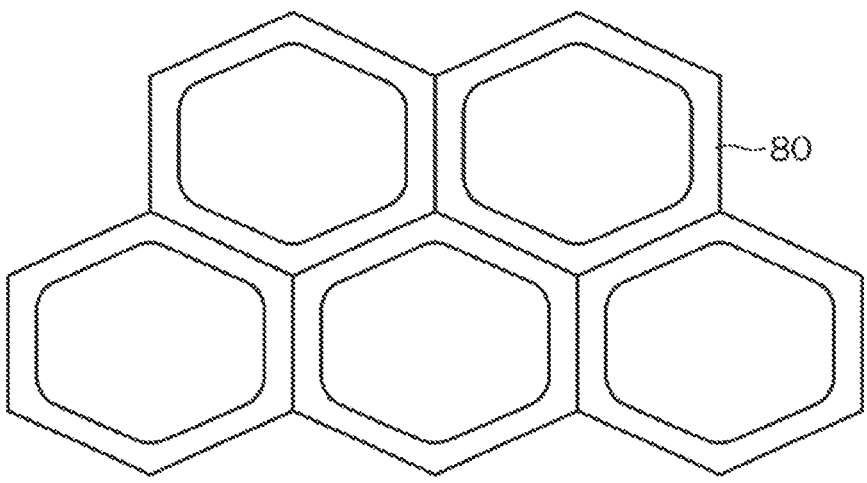
FIG. 9A is a plan view of an on-chip microlens according to a fourth exemplary embodiment.
Figure 9B:
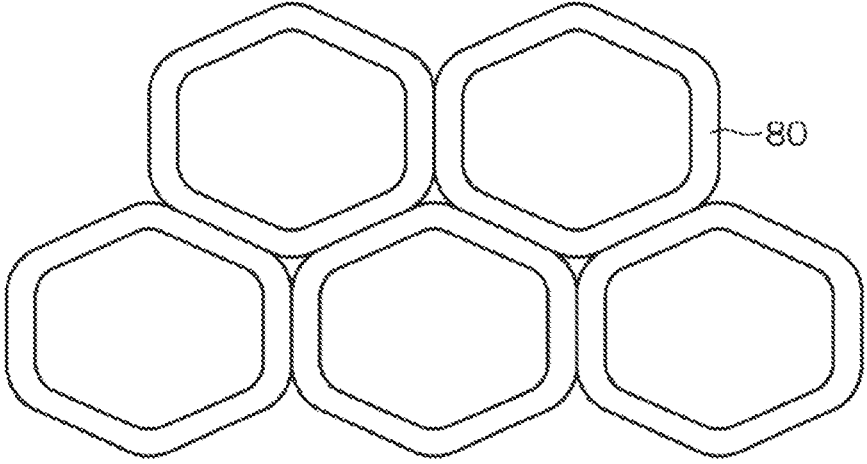
FIG. 9B is a plan view of the on-chip microlens according to the fourth exemplary embodiment.

A fourth exemplary embodiment is a modification of the first exemplary embodiment, and is an example of an on-chip microlens in which the bottom of a truncated pyramid has a hexagonal shape in plan view. FIGS. 9A and 9B are plan views of an on-chip microlens according to the fourth exemplary embodiment. FIG. 9A is an example of a case where there is no gap between the bottom surfaces of the adjacent on-chip microlenses 80, and FIG. 9B is an example of a case where there is a gap.

Fifth Exemplary Embodiment

Figure 10A:
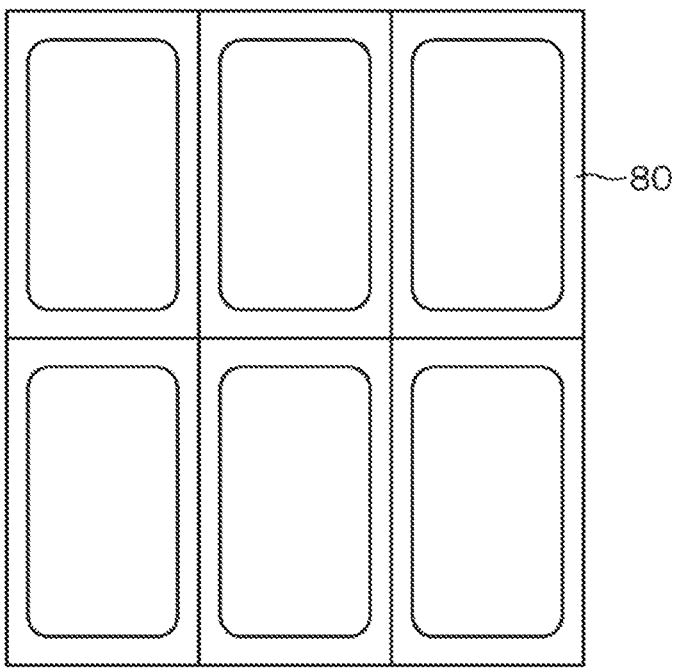
FIG. 10A is a plan view of an on-chip microlens according to a fifth exemplary embodiment.
Figure 10B:
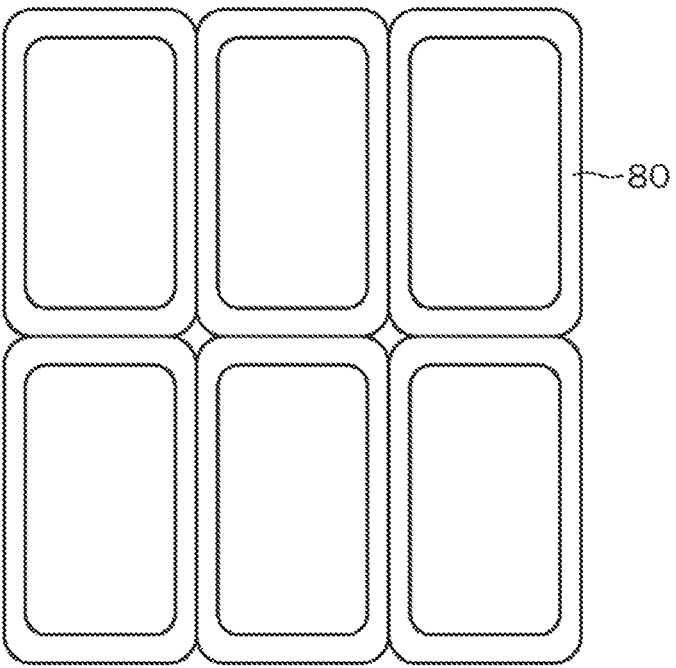
FIG. 10B is a plan view of the on-chip microlens according to the fifth exemplary embodiment.

A fifth exemplary embodiment is a modification of the first exemplary embodiment, and is an example of an on-chip microlens in which the bottom of a truncated pyramid has a rectangular shape in plan view. FIGS. 10A and 10B are plan views of an on-chip microlens according to the fifth exemplary embodiment. FIG. 10A is an example of a case where there is no gap between the bottoms of the adjacent on-chip microlenses 80, and FIG. 10B is an example of a case where there is a gap.

Sixth Exemplary Embodiment

Figure 11A:
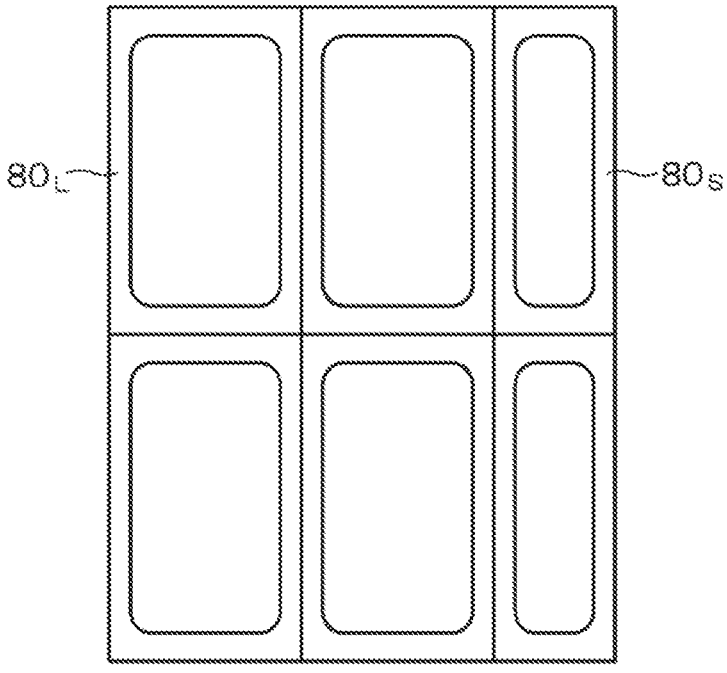
FIG. 11A is a plan view of an on-chip microlens according to a sixth exemplary embodiment.
Figure 11B:
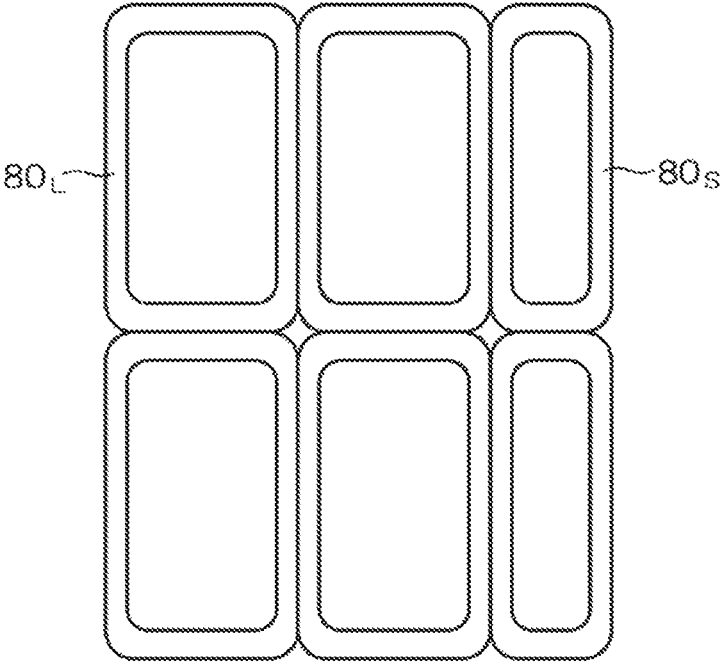
FIG. 11B is a plan view of the on-chip microlens according to the sixth exemplary embodiment.

A sixth exemplary embodiment is a modification of the fifth exemplary embodiment, and is an example of an on-chip microlens in which the bottom of a truncated pyramid has a rectangular shape in plan view, the microlens having the size and shape different for each pixel. FIGS. 11A and 11B are plan views of an on-chip microlens according to the sixth exemplary embodiment. FIG. 11A is an example of a case where there is no gap between the bottoms of the adjacent on-chip microlenses, and FIG. 11B is an example of a case where there is a gap. The sixth exemplary embodiment has a configuration in which on-chip microlenses $80_L$ having a relatively large size and on-chip microlenses $80_S$ having a relatively small size are mixed.

The first exemplary embodiment illustrates a case where the bottom of the truncated pyramid has a quadrangular shape in plan view, the fourth exemplary embodiment illustrates a case where the bottom of the truncated pyramid has a hexagonal shape in plan view, and the fifth and sixth exemplary embodiments illustrate a case where the bottom of the truncated pyramid has a rectangular shape in plan view. However, the shape of the bottom is not limited to these shapes. For example, in plan view, the shape of the bottom of the truncated pyramid may be another polygon such as an octagon or a hexadecagon. Furthermore, the sixth exemplary embodiment is the case where the bottom of the truncated pyramid has a rectangular shape and the size is different for each pixel in plan view. However, it is allowable to have the size different for each pixel not only in the case of the rectangular shape, but also in the case of other polygons including a square and a hexagon.

Seventh Exemplary Embodiment

A seventh exemplary embodiment is an example in which the color filter layer and the on-chip microlens are provided to be biased (offset) with respect to the light emitting unit.

Meanwhile, the organic EL display device 10 has a structure in which light is emitted in a direction perpendicular to the substrate (base 73) by the action of the on-chip microlens 80 in each pixel 20 (subpixels 20R, 20G, and 20B).

Figure 12:
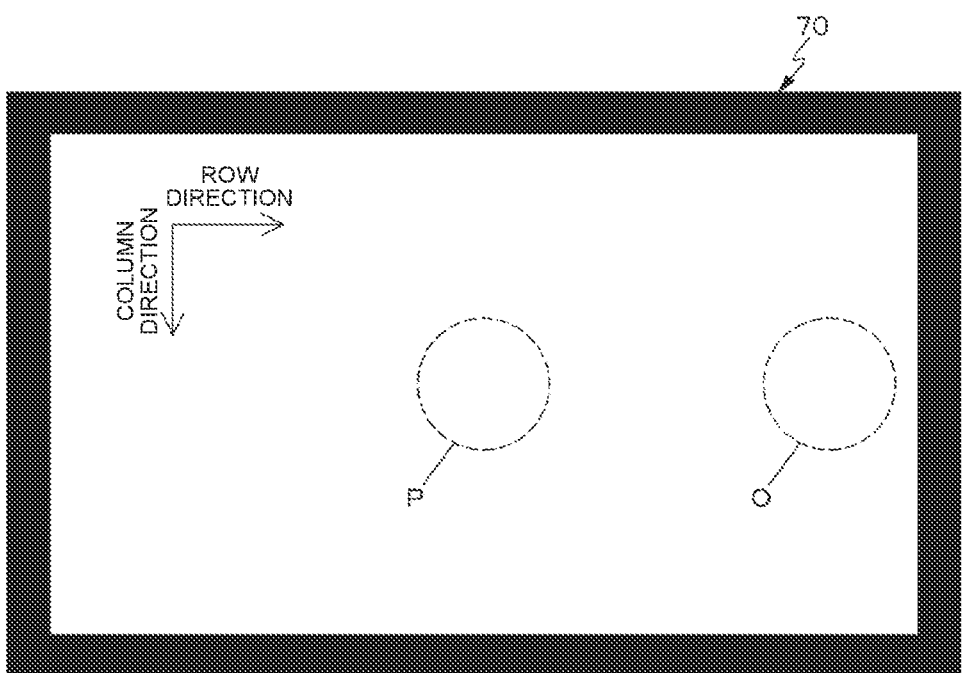
FIG. 12 is a schematic front view of a display panel illustrating brightness in a central portion and both end neighborhood on a display panel.

On the other hand, when viewing the screen in the display panel 70 illustrated in FIG. 12, an observer usually views a central portion P of the display panel 70. At this time, due to the structure of the pixel 20, while the luminance of the central portion P of the display panel 70 is high, the luminance in the both end neighborhood O in the row direction of the display panel 70 is lower than luminance in the central portion P because of small amount of light emitted obliquely. That is, to an observer viewing the central portion P of the display panel 70, the central portion P of the display panel 70 looks bright, while the both end neighborhood O in the row direction looks dark.

To handle this, in seventh exemplary embodiment, the color filter layers $CF_R$, $CF_G$, and $CF_B$ and the on-chip microlens 80 are arranged in a state of being biased (offset) with respect to the organic EL element 21 according to the location on the display panel 70 in which the pixels 20 including the organic EL element 21 as the light emitting unit are two-dimensionally arranged.

Figure 13A:
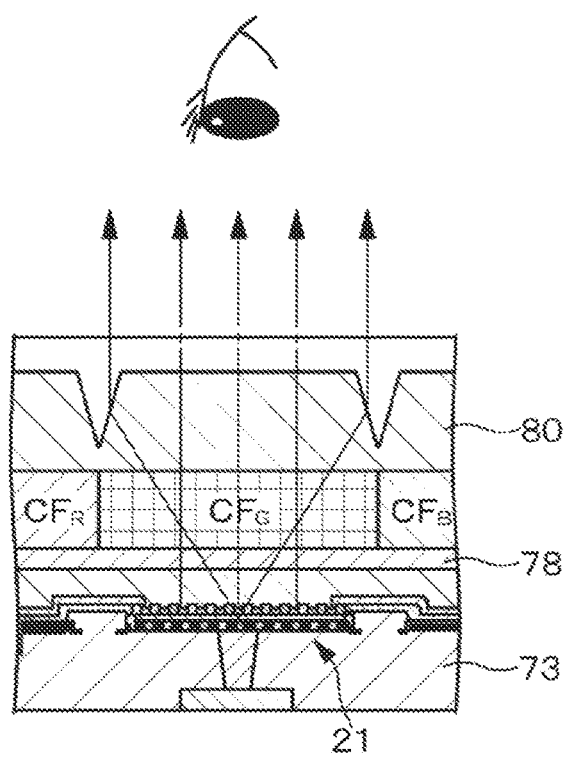
FIG. 13A is a view illustrating a seventh exemplary embodiment, and is a partial end view of a pixel structure in a central portion of a display panel.
Figure 13B:
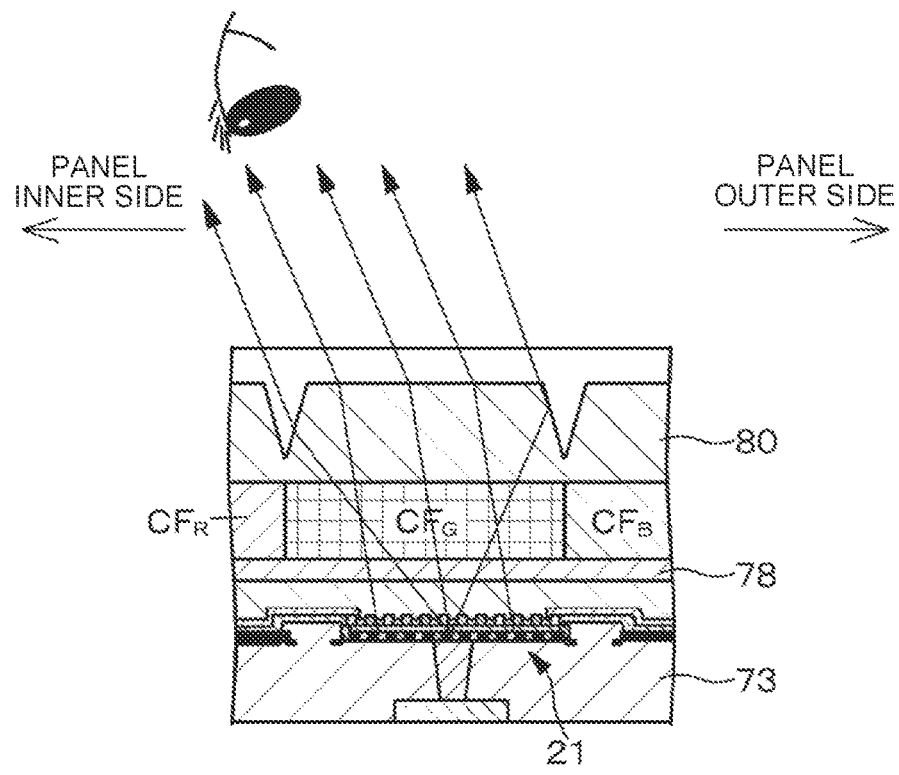
FIG. 13B is a view illustrating the seventh exemplary embodiment, and is a partial end view of a pixel structure in a both end neighborhood on the display panel.

More specifically, the central portion P of the display panel 70 is formed to have a pixel structure as illustrated in FIG. 13A in which the light is emitted in the direction perpendicular to the base 73, while the pixel 20 in the both end neighborhood O in the row direction of the display panel 70 is formed to have a pixel structure as illustrated in FIG. 13B in which the light is emitted toward the inside (central portion) of the display panel 70. Specifically, the color filter layers $CF_R$, $CF_G$, and $CF_B$ and the on-chip microlens 80 in this pixel structure are biased (offset) so as to have the optical axis inclined toward the central portion of the display panel 70.

With the biased color filter layers $CF_R$, $CF_G$, and $CF_B$ and the on-chip microlens 80 so as to have the optical axis inclined toward the central portion of the display panel 70 in this manner, it is possible to increase the light emission luminance in the both end neighborhood O in the row direction of the display panel 70 when the observer views the central portion on the screen. This makes it possible for the observer viewing the central portion P of the display panel 70 to have a high visibility for the both end neighborhood O in the row direction of the display panel 70 similarly to the central portion P.

MODIFICATIONS

Although the technology of the present disclosure has been described above based on the preferred embodiments, the technology of the present disclosure is not limited to the embodiments. The configuration and structure of the display device described in the above embodiment are illustrative and can be modified as appropriate. For example, although the above embodiment has described the technology of the present disclosure using an example of the organic EL device (display panel), the technology of the present disclosure can be applied to display devices other than the organic EL device, specifically, all display devices having a panel structure including an on-chip microlens corresponding to a light emitting unit.

Furthermore, although the above embodiment has been described using an example of the display device using a semiconductor substrate such as a silicon substrate as a substrate of a display panel, the present technology is not limited thereto, and the technology of the present disclosure can be applied to a display device using an insulating substrate such as a glass substrate.

Electronic Device of Present Disclosure

The display device of the present disclosure described above can be used as a display unit (display device) of an electronic device, in any field, that displays a video signal input to the electronic device or a video signal generated in the electronic device as an image or a video. Examples of the electronic device include a television set, a laptop personal computer, a digital still camera, a mobile terminal device such as a mobile phone, a head-mounted display, and the like. However, the present technology is not limited thereto.

According to the technology of the present disclosure, even with a truncated pyramid shape of the on-chip micro-lens, it is possible to suppress the discomfort caused by the sudden luminance change felt by the observer due to the change in the observation position, enabling acquisition of a high-quality display image. Additionally, by using the display device of the present disclosure as a display unit (display device) of an electronic device in any field, a display image having excellent visibility can be obtained.

Hereinafter, specific examples of the electronic device using the display device of the present disclosure will be described using an example of a smartphone, a head-mounted display, and a digital still camera. However, the specific examples exemplified here are merely examples, and are not limited to these specific examples.

Example 1: Example of Smartphone

Figure 14A:
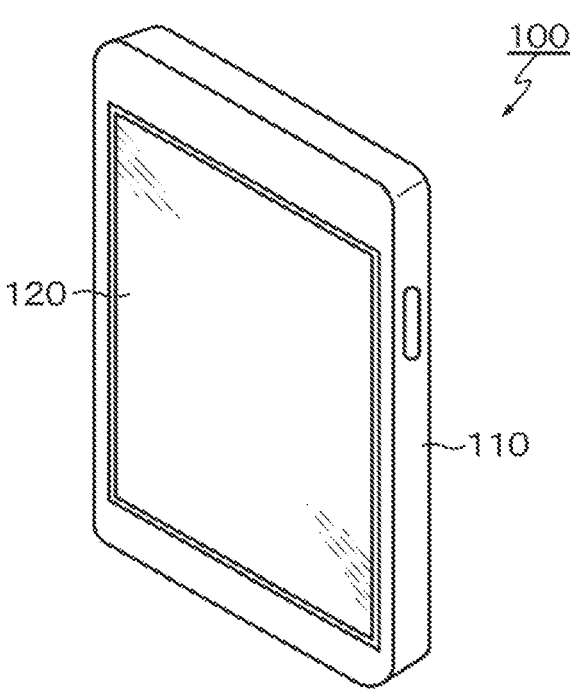
FIG. 14A is an external front view of a smartphone according to Example 1 of an electronic device of the present disclosure.
Figure 14B:
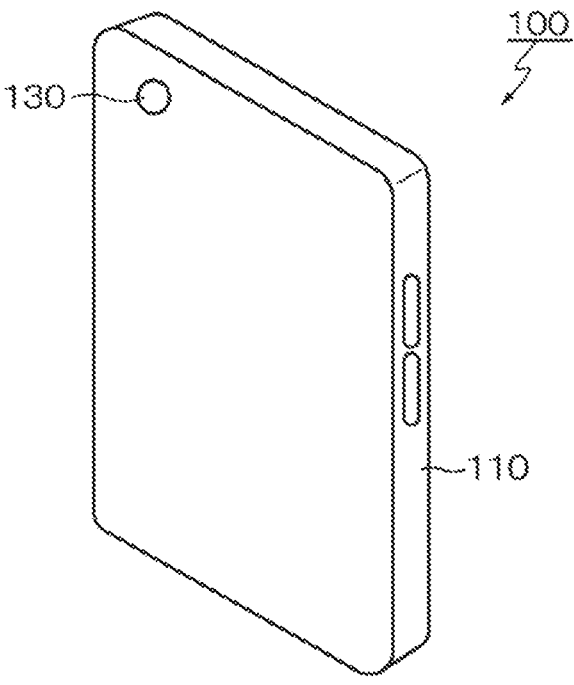
FIG. 14B is an external back view of the smartphone according to Example 1 of the electronic device of the present disclosure.

FIG. 14A illustrates an external front view of a smartphone according to Example 1 of the electronic device of the present disclosure; and FIG. 14B illustrates an external back view thereof. A smartphone 100 according to the present example includes a display unit 120 on the front side of a housing 110. Furthermore, the smartphone 100 includes an imaging unit 130 in an upper portion on the back surface side of the housing 110, for example.

In the smartphone 100 which is an example of a mobile device having the above configuration, the display device of the present disclosure can be used as a display unit 110. That is, the smartphone 100 according to the present specific example 1 is fabricated by using the display device of the present disclosure as the display unit 120.

Example 2: Example of Head-Mounted Display

Figure 15:
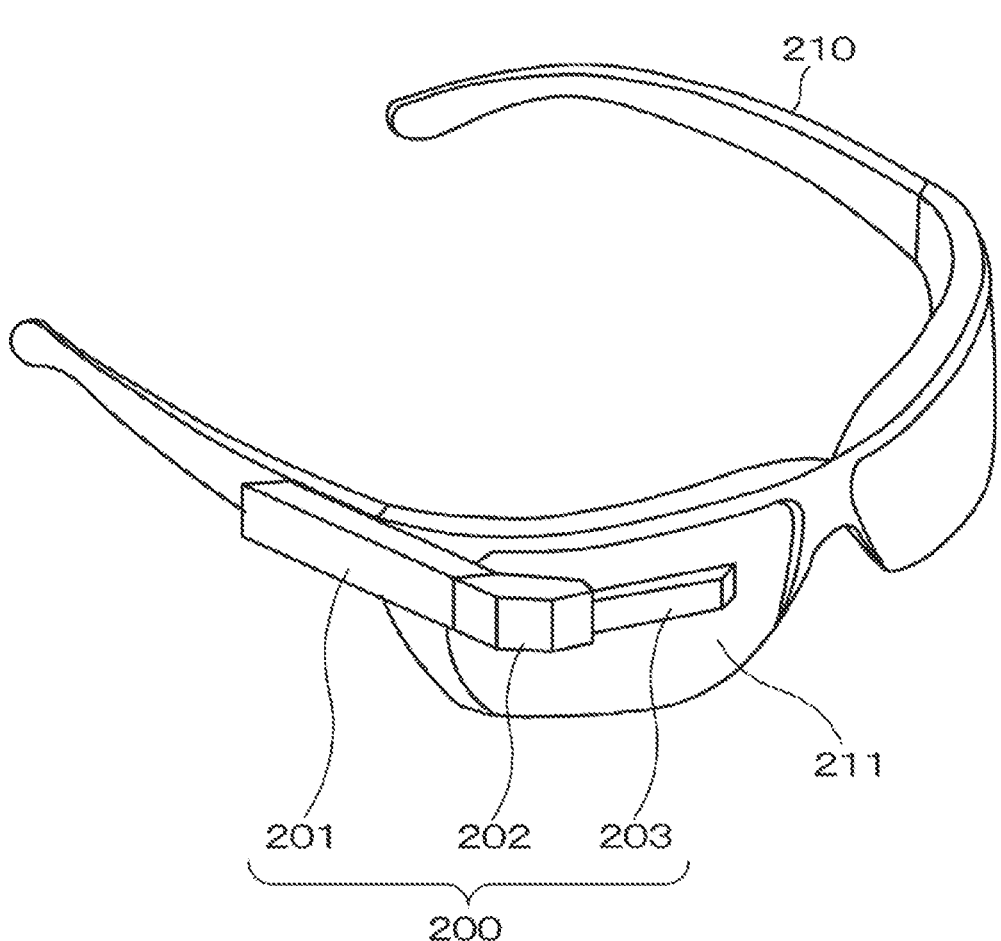
FIG. 15 is an external view of a head-mounted display according to Example 2 of the electronic device of the present disclosure.

FIG. 15 illustrates an external view of a head-mounted display according to Example 2 of the electronic device of the present disclosure.

The head-mounted display 200 according to Example 2 has a transmissive head-mounted display configuration including a main body 201, an arm 202, and a lens barrel 203. The main body 201 is connected to the arm 202 and the eyeglasses 210. Specifically, an end of the main body 201 in the long side direction is attached to the arm 202. The main body 201 has one side of the side surface joined to the eyeglasses 210 via a connection member (not illustrated). Alternatively, that the main body 201 may be directly mounted on the head of the human body.

The main body 201 incorporates a control substrate and a display unit for controlling the operation of the head-mounted display 200. The arm 202 supports the lens barrel 203 onto the main body 201 by joining the main body 201 and the lens barrel 203 to each other. Specifically, the arm 202 is coupled to the end of the main body 201 and to the end of the lens barrel 203 to fix the lens barrel 203 to the main body 201. Furthermore, the arm 202 incorporates a signal line for communicating data related to an image supplied from the main body 201 to the lens barrel 203.

The lens barrel 203 projects image light supplied from the main body 201 via the arm 202 toward the eyes of the user wearing the head-mounted display 200 through lens 211 of the eyeglasses 210. In the head-mounted display 200, the display device of the present disclosure can be used as the display unit built in the main body 201. That is, the head-mounted display 200 according to Example 2 is fabricated by using the display device of the present disclosure as a display unit.

Figure 16A:
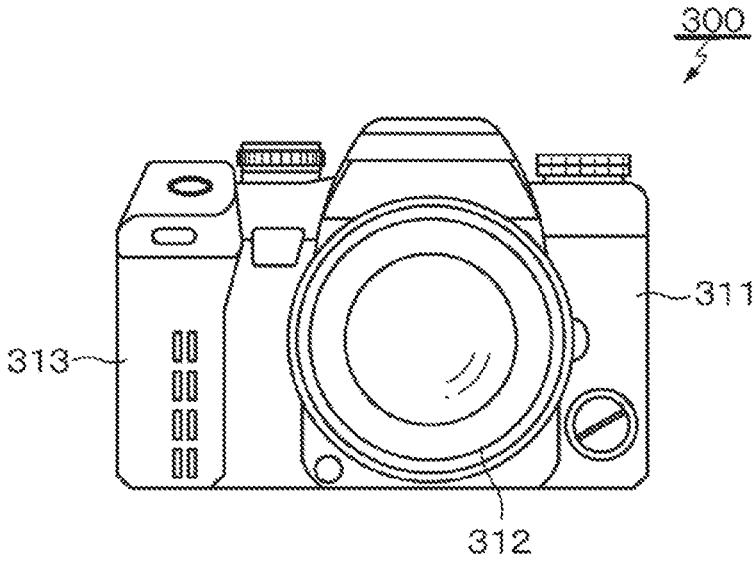
FIG. 16A is a front view of a digital still camera according to Example 3 of the electronic device of the present disclosure.
Figure 16B:
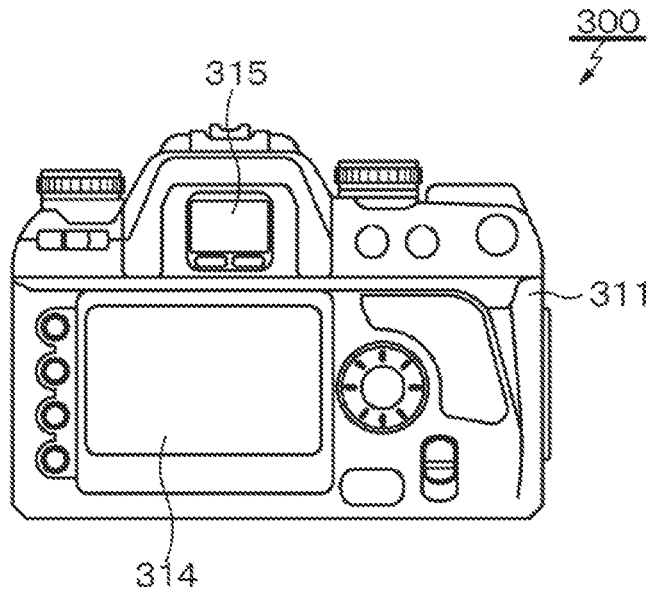
FIG. 16B is a rear view of the digital still camera according to Example 3 of the electronic device of the present disclosure.

FIGS. 16A and 16B illustrate an external view of a single-lens reflex digital still camera with interchangeable lenses according to Example 3 of the electronic device of the present disclosure. FIG. 16A is a front view of the digital still camera, and FIG. 16B is a rear view of the digital still camera.

A digital still camera 300, as a lens interchangeable single lens reflex type camera, includes an interchangeable imaging lens unit (interchangeable lens) 312 on the front right side of a camera main body (camera body) 311, and a grip 313 to be held by a photographer on the front left side, for example. There is provided a monitor 314 substantially at the center of the back surface of the camera main body 311. There is provided a viewfinder (eyepiece window) 315 is provided above the monitor 314. By looking into the viewfinder 315, the photographer can visually recognize an optical image of a subject guided by the imaging lens unit 312 and determine the composition.

In the digital still camera 300 as a lens interchangeable single lens reflex type camera having the above configuration, the display device of the present disclosure can be used as the viewfinder 315. That is, the digital camera 300 as a lens interchangeable single lens reflex type camera according to Example 3 is fabricated by using the display device of the present disclosure as the viewfinder 315.

Configuration Achievable by Present Disclosure

The present disclosure may have the following configurations.

A. Imaging Device

[A-01] A display device comprising:
  a first substrate;
  a second substrate;
  a plurality of light emitting units located between the first substrate and the second substrate and arranged two-dimensionally on a base formed on the first substrate; and
  a plurality of on-chip microlenses provided above the plurality of light emitting units so as to each correspond to each of the light emitting units,
  wherein the on-chip microlens has a truncated pyramid shape, with a rounded corner of a top of the truncated pyramid in plan view.
[A-02] The display device according to [A-01],
  wherein the truncated pyramid has a shape of a bottom different from the shape of the top in plan view.
[A-03] The display device according to [A-02],
  wherein the bottom of the truncated pyramid has a quadrangular shape in plan view.
[A-04] The display device according to [A-03],
  wherein a corner of the bottom of the truncated pyramid is rounded in plan view.
[A-05] The display device according to [A-04],
  wherein a radius of curvature of the rounded corner of the bottom of the truncated pyramid is smaller than a radius of curvature of the rounded corner of the top.
[A-06] The display device according to [A-02],
  wherein the bottom of the truncated pyramid has a hexagonal or a rectangular shape in plan view.
[A-07] The display device according to any of [A-01] to [A-06],
  wherein the truncated pyramid has a size in plan view different for each pixel including the light emitting unit.
[A-08] The display device according to any of [A-01] to [A-07],
  wherein the light emitting unit includes an organic electroluminescence element.
[A-09] The display device according to [A-08],
  wherein the light emitting unit emits white light.
[A-10] The display device according to [A-09],
  wherein a color filter layer corresponding to each light emitting unit is formed above the plurality of light emitting units, and the on-chip microlens is provided above the color filter layer.
[A-11] The display device according to [A-10],
  wherein the color filter layer and the on-chip microlens are provided on a display panel in a state of being biased with respect to the light emitting unit according to a location on a display panel, with pixels including the light emitting unit being two-dimensionally arranged on the display panel.
[A-12] The display device according to [A-11],
  wherein the color filter layer and the on-chip microlens are provided in a state of being biased with respect to the light emitting unit such that an optical axis is inclined toward a central portion of the display panel in both ends in a row direction of the display panel.

B. Electronic Device

[B-01] An electronic device comprising a display device,
  wherein the display device includes:
  a first substrate;
  a second substrate;
  a plurality of light emitting units located between the first substrate and the second substrate and arranged two-dimensionally on a base formed on the first substrate; and
  a plurality of on-chip microlenses provided above the plurality of light emitting units so as to each correspond to each of the light emitting units, and
  the on-chip microlens has a truncated pyramid shape, with a rounded corner of a top of the truncated pyramid in plan view.
[B-02] The electronic device according to [B-01],
  in which a bottom of the truncated pyramid has a shape different from the shape of the top of the truncated pyramid in plan view.
[B-03] The electronic device according to [B-02],
  in which the bottom of the truncated pyramid has a quadrangular shape in plan view.
[B-04] The electronic device according to [B-03],
  in which a corner of the bottom of the truncated pyramid is rounded in plan view.
[B-05] The electronic device according to [B-04],
  in which a radius of curvature of the rounded corner of the bottom of the truncated pyramid is smaller than a radius of curvature of the rounded corner of the top.
[B-06] The electronic device according to [B-02],
  in which the bottom of the truncated pyramid has a hexagonal or a rectangular shape in plan view.
[B-07] The electronic device according to any of [B-01] to [B-06],
  in which the truncated pyramid has a size in plan view different for each pixel including the light emitting unit.
[B-08] The electronic device according to any of [B-01] to [B-07],
  in which the light emitting unit includes an organic electroluminescence element.
[B-09] The electronic device according to [B-08],
  in which the light emitting unit emits white light.
[B-10] The electronic device according to [B-09],
  in which a color filter layer corresponding to each light emitting unit is formed above the plurality of light emitting units, and
  the on-chip microlens is provided above the color filter layer. [B-11] The electronic device according to [B-10],
in which the color filter layer and the on-chip microlens
are provided on a display panel in a state of being
biased with respect to the light emitting unit depending
on a location on a display panel, with pixels including
the light emitting unit being two-dimensionally
arranged on the display panel.
[B-12] The electronic device according to [B-11],
in which the color filter layer and the on-chip microlens
are provided in a state of being biased with respect to
the light emitting unit such that an optical axis is
inclined toward a central portion of the display panel in
both ends in a row direction of the display panel.

REFERENCE SIGNS LIST

10 ORGANIC EL DISPLAY DEVICE
20 PIXEL
20R, 20G, 20B SUBPIXEL
21 ORGANIC EL ELEMENT (LIGHT EMITTING
UNIT)
22 DRIVE TRANSISTOR
23 SAMPLING TRANSISTOR
24 LIGHT EMISSION CONTROL TRANSISTOR
25 RETENTION CAPACITOR
26 AUXILIARY CAPACITOR
30 PIXEL ARRAY UNIT
$31_1$ to $31_m$ SCANNING LINE
$32_1$ to $32_m$ DRIVE LINE
$33_1$ to $33_n$ SIGNAL LINE
40 WRITE SCANNING UNIT
50 DRIVE SCANNING UNIT
60 SIGNAL OUTPUT UNIT
70 DISPLAY PANEL
71 FIRST SUBSTRATE
72 SECOND SUBSTRATE
73 BASE
74 FIRST ELECTRODE LAYER
75 ORGANIC LAYER
76 SECOND ELECTRODE LAYER
77 PROTECTIVE FILM
78 PLANARIZATION LAYER
79 UNDERLYING SUBSTRATE
80 ON-CHIP MICROLENS
81 SEALING RESIN LAYER
BM BLACK MATRIX LAYER
$CF_R$, $CF_G$, $CF_B$ COLOR FILTER LAYER

The invention claimed is:
1. A display device, comprising:
a first substrate;
a second substrate;
a base on the first substrate;
a plurality of light emitting units between the first sub-
strate and the second substrate,
wherein the plurality of light emitting units is in a
two-dimensional arrangement on the base;
a plurality of on-chip microlenses above the plurality of
light emitting units, wherein
each on-chip microlens of the plurality of on-chip
microlenses corresponds to a respective light emit-
ting unit of the plurality of light emitting units,
an on-chip microlens of the plurality of on-chip micro-
lenses has a truncated pyramid shape, and
in plan view, a top surface of the truncated pyramid
shape is flat and has a quadrangular shape with a
rounded corner; and

18 a sealing resin layer between the top surface of the
truncated pyramid shape and the second substrate.
2. The display device according to claim 1, wherein a
shape of a bottom surface of the truncated pyramid shape is
different from a shape of the top surface in the plan view.
3. The display device according to claim 2, wherein the
bottom surface of the truncated pyramid shape has a quad-
rangular shape in the plan view.
4. The display device according to claim 1, wherein a
bottom surface of the truncated pyramid shape has a rounded
corner in the plan view.
5. The display device according to claim 4, wherein a
radius of curvature of the rounded corner of the bottom
surface of the truncated pyramid shape is smaller than a
radius of curvature of the rounded corner of the top surface.
6. The display device according to claim 2, wherein the
bottom surface of the truncated pyramid shape has one of a
hexagonal shape or a rectangular shape in the plan view.
7. The display device according to claim 1, further com-
prising a plurality of pixels, wherein
the plurality of pixels includes the plurality of light
emitting units, and
the truncated pyramid shape has a size in the plan view
different for each pixel of the plurality of pixels.
8. The display device according to claim 1, wherein each
light emitting unit of the plurality of light emitting units
includes an organic electroluminescence element.
9. The display device according to claim 8, wherein each
light emitting unit of the plurality of light emitting units is
configured to emit white light.
10. The display device according to claim 9, further
comprising a color filter layer corresponding to each light
emitting unit of the plurality of light emitting units, wherein
the color filter layer is above the plurality of light emitting
units, and
the on-chip microlens is above the color filter layer.
11. The display device according to claim 10, further
comprising a display panel,
wherein the color filter layer and the on-chip microlens
are on the display panel in a state of being biased with
respect to the respective light emitting unit based on a
location of the respective light emitting unit on the
display panel.
12. The display device according to claim 11, wherein the
color filter layer and the on-chip microlens are in the state of
being biased with respect to the respective light emitting unit
such that an optical axis associated with the on-chip micro-
lens is inclined toward a central portion of the display panel
in both ends of the display panel in a row direction of the
display panel.
13. An electronic device, comprising:
a display device that includes:
a first substrate;
a second substrate;
a base on the first substrate;
a plurality of light emitting units between the first
substrate and the second substrate,
wherein the plurality of light emitting units is in a
two-dimensional arrangement on the base;
a plurality of on-chip microlenses above the plurality of
light emitting units, wherein
each on-chip microlens of the plurality of on-chip
microlenses corresponds to a respective light
emitting unit of the plurality of light emitting
units,
an on-chip microlens of the plurality of on-chip
microlenses has a truncated pyramid shape, and in plan view, a top surface of the truncated pyramid shape is flat and has a quadrangular shape with a rounded corner; and a sealing resin layer between the top surface of the truncated pyramid shape and the second substrate.

14. The display device according to claim 1, wherein the plurality of on-chip microlenses includes a first on-chip microlens and a second on-chip microlens, the first on-chip microlens is adjacent to the second on-chip microlens, and the display device further comprises a gap between a bottom surface of the first on-chip microlens and a bottom surface of the second on-chip microlens.

\* \* \* \* \*